(12) United States Patent
Kosugi (10) Patent No.: US 11,699,666 B2
(45) Date of Patent: Jul. 11, 2023

(54) SEMICONDUCTOR DEVICE AND POWER CONVERSION DEVICE

(71) Applicant: Mitsubishi Electric Corporation, Tokyo (JP)

(72) Inventor: Akira Kosugi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 190 days.

(21) Appl. No.: 17/047,396

(22) PCT Filed: Feb. 19, 2019

(86) PCT No.: PCT/JP2019/006103
§ 371 (c)(1),
(2) Date: Oct. 14, 2020

(87) PCT Pub. No.: WO2019/234984
PCT Pub. Date: Dec. 12, 2019

(65) Prior Publication Data
US 2021/0118815 A1 Apr. 22, 2021

(30) Foreign Application Priority Data
Jun. 6, 2018 (JP) ................................. 2018-108846

(51) Int. Cl.
*H01L 23/00* (2006.01)
*H01L 23/047* (2006.01)
(Continued)

(52) U.S. Cl.
CPC .......... *H01L 23/562* (2013.01); *H01L 23/047* (2013.01); *H01L 23/3121* (2013.01);
(Continued)

(58) Field of Classification Search
None
See application file for complete search history.

(56) References Cited

U.S. PATENT DOCUMENTS

| 5,726,491 A | 3/1998 | Tajima et al. |
| 2003/0016502 A1* | 1/2003 | Yamada .............. H01L 25/0655 257/E23.044 |

(Continued)

FOREIGN PATENT DOCUMENTS

| JP | 6-62550 U | 9/1994 |
| JP | 9-74115 A | 3/1997 |
| JP | 2007-329362 A | 12/2007 |
| JP | 2017-22157 A | 1/2017 |
| JP | 2018-67611 A | 4/2018 |

OTHER PUBLICATIONS

International Search Report and Written Opinion dated May 7, 2019 for PCT/JP2019/006103 filed on Feb. 19, 2019, 9 pages with English translation of International Search Report.

*Primary Examiner* — Michelle Mandala
*Assistant Examiner* — Jordan M Klein
(74) *Attorney, Agent, or Firm* — Xsensus LLP (57) ABSTRACT

A semiconductor device in which occurrence of peeling between a filling member and a metal terminal is suppressed is obtained. The semiconductor device includes: an insulating substrate having a front surface and a back surface, and having a semiconductor element joined to the front surface; a base plate joined to the back surface of insulating substrate; a case member surrounding insulating substrate; a filling member having an upper surface, covering insulating substrate, and filling a region surrounded by base plate and case member; and a metal member having a plate shape that leans toward an upper surface side of filling member inside filling member, has one end joined to the front surface of insulating substrate and another end separated from an inner wall of case member, and is exposed from the upper surface of filling member.

20 Claims, 5 Drawing Sheets

(51) Int. Cl.
*H01L 23/31* (2006.01)
*H01L 23/373* (2006.01)
*H02P 27/08* (2006.01)

(52) U.S. Cl.
CPC .......... *H01L 23/3735* (2013.01); *H01L 24/32* (2013.01); *H01L 24/48* (2013.01); *H01L 24/73* (2013.01); *H01L 2224/32155* (2013.01); *H01L 2224/48225* (2013.01); *H01L 2224/73265* (2013.01); *H01L 2924/1033* (2013.01); *H01L 2924/10253* (2013.01); *H01L 2924/10254* (2013.01); *H01L 2924/10272* (2013.01); *H01L 2924/13055* (2013.01); *H01L 2924/13091* (2013.01); *H01L 2924/15787* (2013.01); *H01L 2924/35121* (2013.01); *H02P 27/08* (2013.01)

(56) References Cited

U.S. PATENT DOCUMENTS

| | | | |
|---|---|---|---|
| 2007/0246833 A1 | 10/2007 | Soga et al. | |
| 2008/0150102 A1* | 6/2008 | Yokomae | H01L 25/162 |
| | | | 257/E23.032 |
| 2012/0039045 A1* | 2/2012 | Yin | G01R 31/129 |
| | | | 361/713 |
| 2013/0082283 A1* | 4/2013 | Otsuki | H01L 25/50 |
| | | | 257/77 |
| 2015/0076517 A1* | 3/2015 | Terai | H01L 29/2003 |
| | | | 257/77 |
| 2017/0063071 A1* | 3/2017 | Yoneyama | H02H 7/222 |
| 2019/0363029 A1* | 11/2019 | Guillon | H01L 23/16 |

\* cited by examiner

SEMICONDUCTOR DEVICE AND POWER CONVERSION DEVICE

CROSS-REFERENCE TO RELATED APPLICATIONS

The present application is based on PCT filing PCT/JP2019/006103, filed Feb. 19, 2019, which claims priority to JP 2018-108846, filed Jun. 6, 2018, the entire contents of each are incorporated herein by reference.

TECHNICAL FIELD

The present invention relates to a semiconductor device and a power conversion device including the semiconductor device.

BACKGROUND ART

Generally, a semiconductor element of the type in which a conduction path is in a vertical direction of the element for the purpose of supporting a high voltage and a large current is called a power semiconductor element (e.g., an IGBT (Insulated Gate Bipolar Transistor), a MOSFET (Metal Oxide Semiconductor Field Effect Transistor), a bipolar transistor, a diode, etc.).

A semiconductor device in which the power semiconductor element is mounted on a circuit board and packaged by a filling member is used in a wide range of fields such as industrial equipment, automobiles, and railways. In recent years, along with a higher performance of equipment equipped with the semiconductor device, there has been an increasing demand for a higher performance of the semiconductor device, such as an increase in rated voltage and rated current, and an expansion in an operating temperature range (higher temperature, lower temperature).

As a package structure of a semiconductor device, what is called a case type is mainstream. In a case type semiconductor device, a case is filled with a filling member for the purpose of preventing insulation failure when a high voltage is applied, and generally, as the filling member of the semiconductor device, an insulating gel filler typified by silicone gel or a thermosetting resin such as an epoxy resin is used.

When filling a liquid filling member before curing into the case of the semiconductor device during manufacturing of the semiconductor device, the filling member may engulf air bubbles. There is a possibility that when the filling member engulfs air bubbles, a defect occurs in the semiconductor device. Therefore, as a method for removing the air bubbles inside the filling member (defoaming treatment), a treatment in which in a state where the filling member is a liquid before curing, the semiconductor device is placed on a flat plane to be exposed to a low-pressure (decompression) environment is performed. When the semiconductor device is exposed to the low-pressure environment, the air bubbles in the filling member expand, the air bubbles rise inside the filling member, and are finally discharged to an outside of the filling member.

As a conventional semiconductor device, there is disclosed a semiconductor device having a lead having a flat portion inside a filling member, and a contact portion between the lead and a case or the like (e.g., Patent Literature 1).

However, in the conventional semiconductor device described in Patent Literature 1, when the semiconductor device is placed on the flat plane during defoaming treatment, inside the filling member, there exists a flat portion parallel to the flat plane, such as the lead. Therefore, even if air bubbles rise inside the filling member, the flat portion of the lead may deter the air bubbles from further rising, so that the air bubbles may remain inside the filling member. When the curing treatment of the filling member is performed in this state and air bubbles remain inside the cured filling member, peeling may occur between the lead and the filling member with the air bubbles as starting points.

Therefore, as a semiconductor device for solving this problem, a semiconductor device having an inclined lead and a contact portion between the lead and a case or the like inside a filling member is disclosed (e.g., Patent Literature 2). By inclining the lead inside the filling member in this manner, the air bubbles on a lower surface side of the lead can be raised to an upper side of the filling member along the inclined lead, which can reduce remaining of the air bubbles on a lower surface of the lead.

CITATION LIST

Patent Literatures

PTL 1: Japanese Patent Laying-Open No. 2007-329362 (page 4, FIG. 1)
PTL 2: Japanese Patent Laying-Open No. H9-74115 (page 3, FIG. 1)

SUMMARY OF INVENTION

Technical Problem

However, in the conventional semiconductor device described in Patent Literature 2, when the semiconductor device is placed on a flat plane during defoaming treatment, inside the filling member, the inclined lead and the contact portion between the lead and the case or the like exist. Therefore, the air bubbles rise to the upper portion of the filling member along the inclined lead, which can reduce the remaining of the air bubbles on the lower surface side of the lead. However, at the contact portion between the lead and the case or the like, the air bubbles may not be able to rise further, and may remain at the contact portion between the lead and the case or the like inside the filling member. When curing treatment of the filling member is performed in this state and the air bubbles remain inside the filling member after curing, peeling between the lead and the filling member at the contact portion between the lead and the case or the like may occur with the air bubbles as starting points.

The present invention has been made to solve the above problem, and an object thereof is to obtain a semiconductor device in which air bubbles inside a filling member are reduced and peeling between a metal member and the filling member is suppressed.

Solution to Problem

A semiconductor device according to the present invention is a semiconductor device including: an insulating substrate having a front surface and a back surface, and having a semiconductor element joined to the front surface; a base plate joined to the back surface of the insulating substrate; a case member surrounding the insulating substrate; a filling member having an upper surface, covering the insulating substrate, and filling a region surrounded by the base plate and the case member; and a metal member having a plate shape that leans toward an upper surface side of the filling member inside the filling member, has one end joined to the front surface of the insulating substrate and another end separated from an inner wall of the case member, and is exposed from the upper surface of the filling member.

Advantageous Effects of Invention

According to the present invention, since the metal member leans toward the upper surface side of the filling member, and the other end is separated from the inner wall of the case member and is exposed from the upper surface of the filling member, it is possible to reduce the air bubbles inside the filling member and suppress peeling between the metal member and the filling member.

DESCRIPTION OF EMBODIMENTS

First, an overall configuration of a semiconductor device of the present invention will be described with reference to the drawings. Note that the drawings are schematic and do not reflect exact sizes and the like of shown components.

Moreover, components given the same reference signs are identical or equivalent, and this is common to full texts of the description.

First Embodiment

Figure 1:
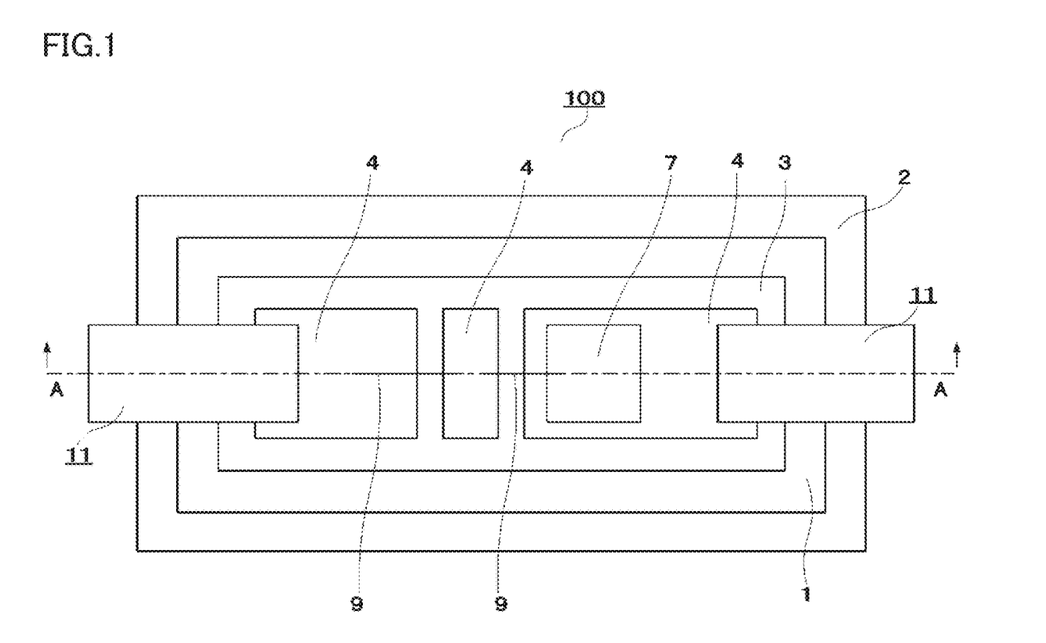
FIG. 1 is a schematic structural plan view showing a semiconductor device in a first embodiment of the present invention.
Figure 2:
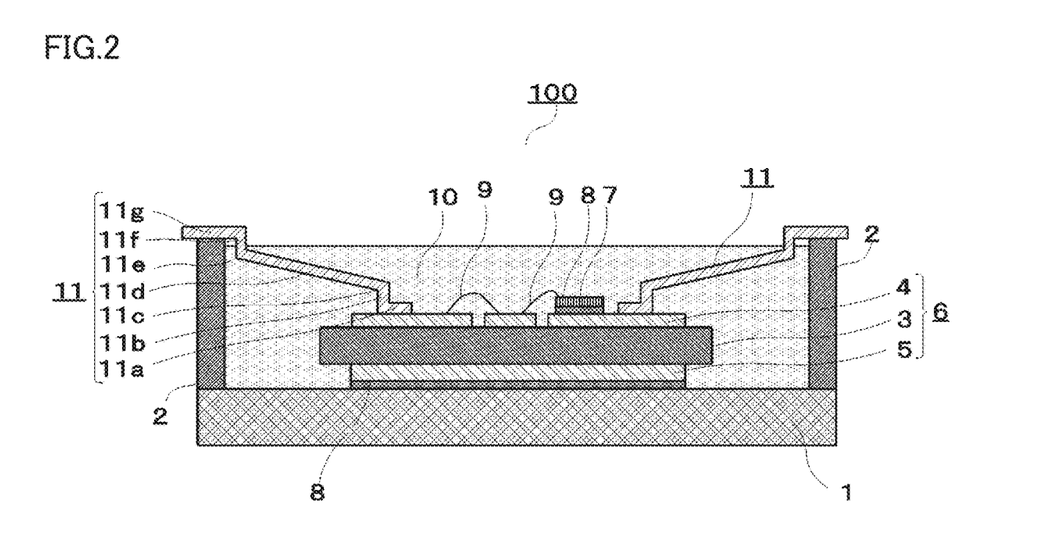
FIG. 2 is a schematic structural cross-sectional view showing the semiconductor device in the first embodiment of the present invention.

FIG. 1 is a schematic structural plan view showing a semiconductor device in a first embodiment of the present invention. FIG. 2 is a schematic structural cross-sectional view showing the semiconductor device in the first embodiment of the present invention. FIG. 2 is a schematic structural cross-sectional view taken along one-dot chain line AA in FIG. 1. In the figures, a semiconductor device 100 includes a base plate 1, a case member 2, an insulating substrate 6, a semiconductor element 7, joining materials 8, bonding wires 9, a filling member 10, and electrode terminals 11, which are metal members.

In FIG. 1, case member 2 is joined to an outer peripheral portion of base plate 1 so as to surround insulating substrate 6. A part of each of electrode terminals 11 is disposed on a top of case member 2 in order to make an electrical connection to an outside.

In FIG. 2, insulating substrate 6 includes an insulating layer 3 such as ceramics, and metal layers 4, 5 formed on a front surface and a back surface of insulating layer 3. As insulating layer 3, silicon nitride ($Si_3N_4$), aluminum nitride (AlN), aluminum oxide (AlO:alumina), zirconia (Zr)-containing alumina, or boron nitride (BN) can be used. In particular, AlN, $Si_3N_4$ are preferable from the viewpoint of thermal conductivity, and $Si_3N_4$ is more preferable from the viewpoint of material strength. Further, an epoxy resin or the like may be used as insulating layer 3.

Insulating substrate 6 has heat dissipation and insulating properties, and is not limited to the above materials, but may be provided with metal layers 4, 5 on insulating layer 3 such as a resin cured product in which ceramic powder is dispersed or a resin cured product in which a ceramic plate is embedded.

Moreover, in the case where insulating layer 3 of insulating substrate 6 is a resin cured product in which ceramic powder is dispersed, as the ceramic powder used for insulating layer 3, AlO, $SiO_2$, AlN, BN, $Si_3N_4$, or the like is used, but the ceramic powder is not limited thereto, and diamond, silicon carbide (SiC), boron oxide ($B_2O_3$), or the like may be used. Further, resin powder such as silicone resin or acrylic resin may be used.

While a spherical shape is often used as a powder shape, the powder shape is not limited thereto, and may be a crushed shape, a granular shape, a scaly shape, an aggregate, or the like. A filling amount of the powder only needs to bring about the necessary heat dissipation and insulating properties. As the resin used for insulating substrate 6, an epoxy resin is usually used, but the resin is not limited thereto, and a polyimide resin, a silicone resin, an acrylic resin, or the like may be used, and any material having both insulating properties and adhesiveness can be used.

Metal layers 4, 5 formed on both the surfaces (front surface and back surface) of insulating layer 3 are made of metal having the same dimensions (size) and thickness. However, since an electric circuit is formed on each of metal layers 4, 5, a pattern shape may be different. The size of metal layers 4, 5 is smaller than that of insulating layer 3. By making the size of metal layers 4, 5 smaller than that of insulating layer 3, a creepage distance between metal layers 4, 5 can be expanded and the insulating properties can be secured. Furthermore, making the size of metal layer 5 smaller than that of insulating layer 3 allows filling member 10 to be wrapped around a back surface side of insulating layer 3.

As metal layers 4, 5, a metal having excellent electric conduction and thermal conductivity, for example, aluminum and aluminum alloys (ALSIC or the like), copper and copper alloys (CuMo or the like), iron, or the like, can be used. In particular, it is preferable to use copper from the viewpoint of heat conduction and electric conduction. However, the material is not limited thereto, and any material having necessary heat dissipation characteristics may be used. Moreover, a material obtained by compounding the foregoing materials may be used. Further, copper/invar/a composite material of copper and the like may be used. Further, the surfaces of metal layers 4, 5 may be subjected to nickel plating, but the invention is not limited thereto, and gold or tin plating may be performed, so that any structure can be used as long as it can supply a necessary current and voltage to semiconductor element 7.

Semiconductor element 7 is mounted at a predetermined position on metal layer 4 on a front surface side of insulating layer 3. Semiconductor element 7 is electrically joined onto metal layer 4 on the front surface side of insulating layer 3 with joining material 8 such as, for example, solder interposed. Further, for example, as semiconductor element 7, a semiconductor element for power control (switching element) such as a MOSFET (Metal Oxide Semiconductor Field Effect Transistor) and an IGBT (Insulated Gate Bipolar Transistor) configured to control a large current, a diode for return current, or the like is used.

As a material for forming semiconductor element 7, in addition to silicon (Si), for example, SiC, which is a wide band gap semiconductor, can be applied. A Si semiconductor element or a SiC semiconductor element using these as a substrate material is applied. Moreover, as the wide band gap semiconductors, gallium nitride (GaN)-based materials, diamond (C), and the like are cited. In the case where the wide band gap semiconductor is used, since an allowable current density is high and a power loss is low, a number of parts can be reduced, and the semiconductor device can be downsized.

For joining metal layer 4 on a front surface side of insulating substrate 6 and semiconductor element 7, solder is usually used as joining material 8. However, joining material 8 is not limited to solder, and in addition to solder, for example, sintered silver, a conductive adhesive, a liquid phase diffusion material, or the like can be applied. The sintered silver or the liquid phase diffusion material has a higher melting temperature than the solder material, and does not remelt during joining metal layer 5 on the back surface side of insulating substrate 6, and base plate 1, which improves joining reliability between semiconductor element 7 and insulating substrate 6.

Furthermore, since the melting temperature of sintered silver or a liquid phase diffusion material is higher than that of the solder, an operating temperature of semiconductor device 100 can be increased. Sintered silver has better thermal conductivity than solder, so that the heat dissipation of semiconductor element 7 is improved and the reliability is improved. Since the liquid phase diffusion material can be joined with a load lower than that of sintered silver, processability is good, and an influence of damage on semiconductor element 7 by a joining load can be prevented.

Base plate 1 is joined to metal layer 5 on the back surface side of insulating substrate 6 with joining material 8 such as solder interposed. Base plate 1 serves as a bottom plate of semiconductor device 100, and a region surrounded by case member 2 disposed in a periphery of base plate 1, and base plate 1 is formed. As a material of base plate 1, copper, aluminum or the like is used. Further, while a front surface of base plate 1 may be subjected to nickel plating, the invention is not limited thereto, and it may be subjected to gold plating or tin plating.

As joining material 8 used for joining metal layer 5 on the back surface side of insulating substrate 6, and base plate 1, for example, solder can be used. As the solder, a Sn—Sb composition type solder material is preferable from the viewpoint of joining reliability. To the joining between metal layer 5 on the back surface side of insulating substrate 6, and base plate 1, in addition to solder, sintered silver and a liquid phase diffusion material can be applied as in the joining between metal layer 4 on the front surface side of insulating substrate 6, and semiconductor element 7.

Here, the insulating properties can be secured not by insulating substrate 6 but by an insulating sheet. In this case, for example, the insulating sheet is directly attached to base plate 1, and metal layer 4 having a wiring pattern formed on the insulating sheet, and semiconductor element 7 are joined and laminated in this order by soldering or the like.

Base plate 1 is a plate where at least a front surface side thereof, which is an insulating substrate 6 side, is a flat surface, and where both of a front surface and a back surface thereof are usually flat.

Case member 2 is required not to undergo thermal deformation within the operating temperature region of semiconductor device 100, and to still maintain its insulating properties. Therefore, case member 2 is preferably made of a resin material having a high thermal softening point, and for example, a resin having a high softening point such as a PPS (Poly Phenylene Sulfide) resin or a PBT (Polybutylene terephthalate) resin is used. However, the material is not particularly limited as long as it does not undergo thermal deformation within the operating temperature region of semiconductor device 100 and has insulating properties.

Case member 2 and base plate 1 are adhered to each other with an adhesive (not shown). The adhesive is filled between a bottom surface of case member 2, and base plate 1. As a material of the adhesive, generally, a silicone resin, an epoxy resin or the like is used, and the adhesive is applied to at least one of case member 2 and base plate 1, and after fixing case member 2 and base plate 1, they are joined by heat curing.

Each of electrode terminals 11 is insert-molded or outsert-molded on case member 2 and is used for inputting/outputting current and voltage with respect to the outside. A part of electrode terminal 11 is disposed inside filling member 10 and leans (is inclined) toward an upper surface side of filling member 10. One end of electrode terminal 11 is bent and joined to a front surface (metal layer 4) of insulating substrate 6. Another end of electrode terminal 11 is bent and exposed (projected) from an upper surface of filling member 10. Another end side of electrode terminal 11 is disposed inside case member 2 at a distance from an inner wall (side surface) of case member 2. Moreover, the other end side of electrode terminal 11 has a structure projecting from the upper side of case member 2 to the outside of case member 2.

Electrode terminal 11 includes a joining portion 11a, leg portions 11b, 11f, bent portions 11c, 11e, an inclined portion (leaning portion) 11d, and a terminal portion 11g. Joining portion 11a of electrode terminal 11 is joined to a predetermined position of metal layer 4 on the front surface side of insulating substrate 6. Terminal portion 11g of electrode terminal 11 is an electrical connection portion with the outside. Inclined portion 11d of electrode terminal 11 is a leaning portion of electrode terminal 11, is disposed inside filling member 10, and leans (linearly) toward the upper surface side of filling member 10 in a linear shape. From a joining portion 11a side of electrode terminal 11 toward a terminal portion 11g side of electrode terminal 11, electrode terminal 11 is inclined toward the upper surface side of filling member 10. In other words, electrode terminal 11 leans (is inclined) such that a distance to the upper surface of filling member 10 becomes smaller as it goes from the one end to the other end. Further, inclined portion 11d of electrode terminal 11 continuously and directly connects bent portion 11c on a one end side and bent portion 11e on the other end side.

Bent portions 11c, 11e of electrode terminal 11 are formed at both ends (both sides) of inclined portion 11d of electrode terminal 11. In other words, inclined portion 11d of electrode terminal 11 is formed between bent portion 11c on the one end side and bent portion 11e on the other end side. Moreover, bent portions 11c, 11e of electrode terminal 11 are disposed inside filling member 10. One bent portion 11c (a first bent portion), which is on the one end side of electrode terminal 11, is connected to joining portion 11a with leg portion 11b (a first leg portion) interposed. Other bent portion 11e (a second bent portion), which is on the other end side of electrode terminal 11, is connected to terminal portion 11g with leg portion 11f (a second leg portion) interposed. Bent portions 11c, 11e connect inclined portion 11d and joining portion 11a or terminal portion 11g so that leg portions 11b, 11f are parallel to an inner wall surface of case member 2. Here, "parallel" in disposing bent portions 11c, 11e so as to be parallel to the inner wall surface of case member 2 means a parallelism within a range where air bubbles generated inside filling member 10, which will be described later, at connection sites between bent portions 11c, 11e and inclined portion 11d can move without staying at these connection sites. Further, leg portion 11f of electrode terminal 11 is disposed at a distance (with a gap) from the inner wall (side surface) of case member 2. As described above, leg portion 11f of electrode terminal 11 is disposed at a distance from the inner wall of case member 2, so that the air bubbles generated inside filling member 10 and rising to the upper surface of filling member 10 during manufacturing of semiconductor device 100 can be discharged to the outside of filling member 10 without remaining (stagnating) on a lower surface side of electrode terminal 11. This can reduce the air bubbles inside filling member 10.

As described above, it is desirable that electrode terminal 11 is bent at two or more locations inside filling member 10. Since electrode terminal 11 is bent at two or more locations, inside filling member 10, a leaning surface (surface that is not parallel) with respect to the front surface of base plate 1 can be obtained, so that the air bubbles inside filling member 10 can finally escape (are discharged) to the outside of filling member 10. Further, by bending a part of electrode terminal 11, a space between electrode terminal 11 and the other members can be secured, and for example, during manufacturing of semiconductor device 100, a filling property of filling member 10 between insulating substrate 6 and electrode terminal 11 on the lower side of electrode terminal 11 can be improved.

Electrode terminal 11 has a plate shape. As electrode terminal 11, for example, a copper plate having a thickness of 0.5 mm, and processed into a predetermined shape by etching, die punching or the like can be used. Moreover, inclined portion 11d of electrode terminal 11 can be molded into a mold by bending, pressing, or the like, and a method for forming inclined portion 11d is not particularly limited as long as it is a method by which a required lean (inclination) can be formed. As a material of electrode terminal 11, for example, a plate-shaped member made of aluminum, an aluminum alloy, a copper alloy, or the like can also be used.

Bonding wires 9 electrically connect between metal layers 4 or between semiconductor element 7 and electrode terminal 11. Each of bonding wires 9 is, for example, a wire material made of an aluminum alloy or a copper alloy having a wire diameter of 0.1 mm to 0.5 mm. Further, bonding wire 9 may have a necessary thickness (size), depending on a current density of semiconductor element 7 and the like, and a necessary number of bonding wires 9 can be provided. Note that while, here, bonding wires 9 are used for connection, ribbons (plate-shaped members) may be used for connection. Further, as a method or a structure for joining bonding wire 9 and a portion to be joined, it is possible to use a molten metal joining of melting a metal piece such as copper or tin, ultrasonic joining, or the like, but the method or the structure is not particularly limited as long as it is a method/structure that enables the necessary current and voltage to be supplied to semiconductor element 7.

Filling member 10 is filled into the region surrounded by case member 2 and base plate 1 for the purpose of ensuring insulating properties inside semiconductor device 100. Filling member 10 seals insulating layer 3, metal layers 4, 5, semiconductor element 7, bonding wires 9, and a part of electrode terminals 11. A silicone product such as silicone gel is used for filling member 10, but the material of filling member 10 is not limited thereto, and may be a resin to which an inorganic filler having excellent thermal conductivity such as alumina or silica is added. Moreover, the resin may be any material having desired insulating properties, heat resistance, and adhesiveness, such as an epoxy resin, a phenol resin, and a polyimide resin.

When semiconductor device 100 is not placed on the flat plane but is placed on a slope during the defoaming treatment of filling member 10, the air bubbles inside filling member 10 move to an upper side of the slope, but if a viscosity of filling member 10 before the curing treatment (uncured) is low, there is a possibility that filling member 10 leaks from an inside of case member 2 to the outside during the defoaming treatment. Further, if the viscosity of filling member 10 is high, it does not leak from the inside of case member 2 to the outside, but it cannot fill a narrow gap region such as between the members, and cannot serve as filling member 10. Therefore, the material of filling member 10 is limited, and a degree of freedom in selection is impaired. However, in the first embodiment, the defoaming treatment of filling member 10 is performed with semiconductor device 100 disposed on a plane. As the viscosity (viscidity) of filling member 10 in this case, since semiconductor device 100 is disposed on the flat plane, there is no restriction on the viscosity of filling member 10 as described above, and thus, the material can be freely selected so that the insulating properties, the heat resistance, and the adhesiveness can be obtained.

A lid material (not shown) is used as necessary and is disposed on an upper side of case member 2 (an opposite side of the side in contact with base plate 1). The lid material separates the inside and the outside of the semiconductor device and prevents dust and the like from entering the inside of the semiconductor device. The lid material is fixed to case member 2 with an adhesive (not shown) or a screw (not shown).

Next, functions and effects of electrode terminal 11 in the first embodiment will be described with reference to FIG. 2.

In FIG. 2, electrode terminal 11 leans toward the upper surface side of filling member 10 inside filling member 10. The leaning portion of electrode terminal 11 is inclined portion 11d. From a structural aspect, inclined portion 11d of electrode terminal 11 leans toward the upper surface side of filling member 10 in a cross section in a direction connecting the one end of electrode terminal 11 and the other end of electrode terminal 11. In other words, inclined portion 11d of electrode terminal 11 leans toward the upper surface side of filling member 10 in the cross section in the direction connecting joining portion 11a and terminal portion 11g. From the viewpoint of electrical characteristics, inclined portion 11d of electrode terminal 11 is inclined toward the upper surface side of filling member 10 in the cross section in the same direction (parallel direction) as a direction of a current flowing through electrode terminal 11. That is, inclined portion 11d of electrode terminal 11 has a structure that leans (is inclined) toward the upper surface side of filling member 10 as it goes from the one end to the other end. For example, in FIG. 2, inclined portion 11d of electrode terminal 11 is inclined such that it becomes farther from the front surface of insulating substrate 6, and becomes closer to the upper surface of filling member 11 as it goes from metal layer 4 to case member 2. Here, in electrode terminal 11, the current flows between joining portion 11a and terminal portion 11g of electrode terminal 11.

In a manufacturing process of semiconductor device 100, filling member 10 having a predetermined viscosity is filled into the region surrounded by base plate 1 and case member 2. At this time, inside the region surrounded by base plate 1 and case member 2, insulating substrate 6 in which metal layer 5 on the back surface side of insulating substrate 6 is joined to the front surface of base plate 1, using joining material 8, is disposed. Semiconductor element 7 is joined to metal layer 4 on the front surface side of insulating substrate 6 at a predetermined position, using joining material 8. Further, the plurality of metal layers 4 and semiconductor element 7 are electrically connected, using bonding wires 9. Further, electrode terminals 11 are joined to predetermined positions of metal layers 4.

Next, in order to remove (discharge), from the inside of filling member 10, the air bubbles remaining inside filling member 10, the defoaming treatment of semiconductor device 100 filled with filling member 10 is performed. Usually, the defoaming treatment is performed by placing semiconductor device 100 on the plane inside a defoaming treatment device so that the upper surface of filling member 10 is flat, and reducing a pressure inside the defoaming treatment device.

After the defoaming treatment, a curing treatment is performed to cure filling member 10, and the lid material is used as necessary to dispose the lid material on the upper side of case member 2, by which semiconductor device 100 is finished.

In the above defoaming treatment process, in the case where each of electrode terminals 11 inside filling member 10 is not in the shape inclined to the upper surface side of filling member 10 (electrode terminal 11 has a flat portion), it is highly possible that air bubbles generated below electrode terminal 11 inside filling member 10 rise to the upper surface side of filling member 10 due to buoyancy or the like, and remain on a lower surface side of the flat portion of electrode terminal 11. When semiconductor device 100 is operated with the air bubbles remaining on the lower surface side of the flat portion of electrode terminal 11, a temperature of semiconductor device 100 itself or electrode terminal 11 rises, and the air bubbles expand as an ambient temperature rises.

Therefore, peeling occurs between electrode terminal 11 and filling member 10 in the vicinity of the lower surface side of the flat portion of electrode terminal 11 where the air bubbles remain. When the air bubbles expand and the peeling develops, for example, dielectric breakdown occurs between electrode terminal 11 and metal layer 5 of insulating substrate 6 or between electrode terminal 11 and base plate 1, so that reliability of semiconductor device 100 deteriorates. Further, even if the dielectric breakdown of semiconductor device 100 does not occur, it is conceivable that poor appearance of semiconductor device 100 may occur due to the expansion of the air bubbles. Further, in the case where electrode terminal 11 has a shape in contact with the inner wall of case member 2, it is conceivable that the air bubbles remain at a contact portion between electrode terminal 11 and the inner wall of case member 2 inside filling member 10. Even in this case, peeling occurs between electrode terminal 11 and filling member 10 at the contact portion between electrode terminal 11 and case member 2. As a result, the reliability of semiconductor device 100 deteriorates.

However, in the first embodiment, since inclined portion 11d of electrode terminal 11 has the shape that leans toward the upper surface side of filling member 10, which allows the air bubbles generated inside filling member 10 to move (rise) toward the upper surface side of filling member 10 along inclined portion 11d of electrode terminal 11 without remaining at the lower portion of electrode terminal 11. Therefore, the air bubbles can escape to the outside from the upper surface of filling member 10, and the occurrence of peeling at an interface between electrode terminal 11 and filling member 10 due to the remaining air bubbles can be suppressed. As a result, it is possible to prevent insulation failure and poor appearance of semiconductor device 100.

Further, since leg portion 11f formed continuously from bent portion 11e of inclined portion 11d of electrode terminal 11 is disposed at a distance from the inner wall of case member 2, the air bubbles rising along inclined portion 11d of electrode terminal 11 do not remain inside filling member 10 in the vicinity of the inner wall of case member 2 and can rise to the upper surface side of filling member 10. Therefore, the air bubbles can escape to the outside from the upper surface of filling member 10, and the occurrence of peeling at the interface between electrode terminal 11 and filling member 10 due to the remaining air bubbles can be suppressed. As a result, it is possible to prevent insulation failure and poor appearance of semiconductor device 100.

Figure 3:
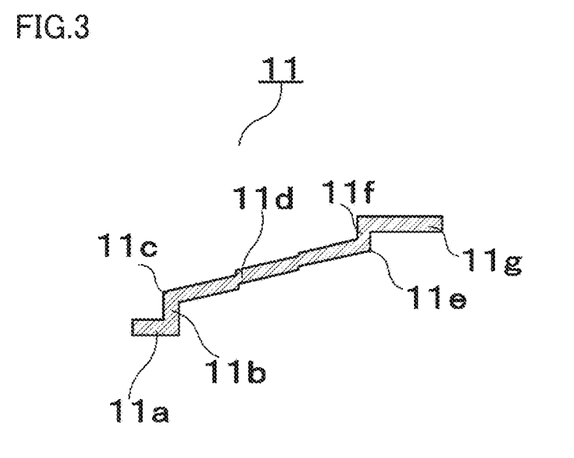
FIG. 3 is a schematic structural cross-sectional view showing another metal member of the semiconductor device in the first embodiment of the present invention.
Figure 4:
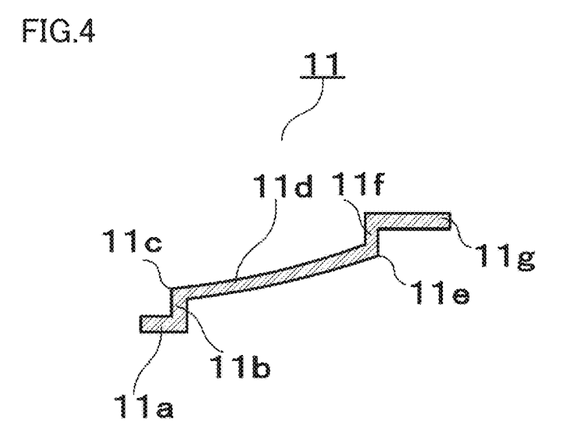
FIG. 4 is a schematic structural cross-sectional view showing another metal member of the semiconductor device in the first embodiment of the present invention.

FIG. 3 is a schematic structural cross-sectional view showing another metal member of the semiconductor device in the first embodiment of the present invention. FIG. 4 is a schematic structural cross-sectional view showing another metal member of the semiconductor device in the first embodiment of the present invention. In each of the figures, electrode terminal 11 includes joining portion 11a, leg portions 11b, 11f, bent portions 11c, 11e, inclined portion 11d, and terminal portion 11g.

Inclined portion 11d of electrode terminal 11 only needs to lean linearly (in a linear manner) toward the upper surface side of filling member 10 so that the air bubbles can move. Preferably, inclined portion 11d of electrode terminal 11 forms an angle larger than or equal to 5 degree, and smaller than or equal to 90 degrees with respect to the front surface of insulating substrate 6. Further, inclined portion 11d of electrode terminal 11 is not limited to a linear plane, but may have a shape having a continuous inclined surface, or an inclined stepped shape (multistepped shape) as shown in FIG. 3 as long as the air bubbles can move to the upper surface side of filling member 10 along inclined portion 11d of electrode terminal 11 without remaining on the lower surface side of electrode terminal 11.

Further, a shape with a curvature (curved) projected on the lower surface side of electrode terminal 11 (shape projected on the front surface side of insulating substrate 6) as shown in FIG. 4 may be employed. Further, in a range where the air bubbles can move to the upper surface side of filling member 10 along the shape of electrode terminal 11 without remaining on the lower surface side of electrode terminal 11, contrary to FIG. 4, a shape with a curvature (curved) projected on the upper surface side of electrode terminal 11 may be employed.

Furthermore, the angle of inclination of inclined portion 11d of electrode terminal 11 does not need to be constant. For example, inclined portion 11d may be a combination of inclined portions having a plurality of angles, may have a plurality of curvatures, and may have a shape obtained by combining shapes having curvatures projected on the upper surface or the lower surface of the electrode terminal, and it is sufficient that the air bubbles generated inside filling member 10 can move to the upper side of filling member 10 along inclined portion 11d.

Figure 5:
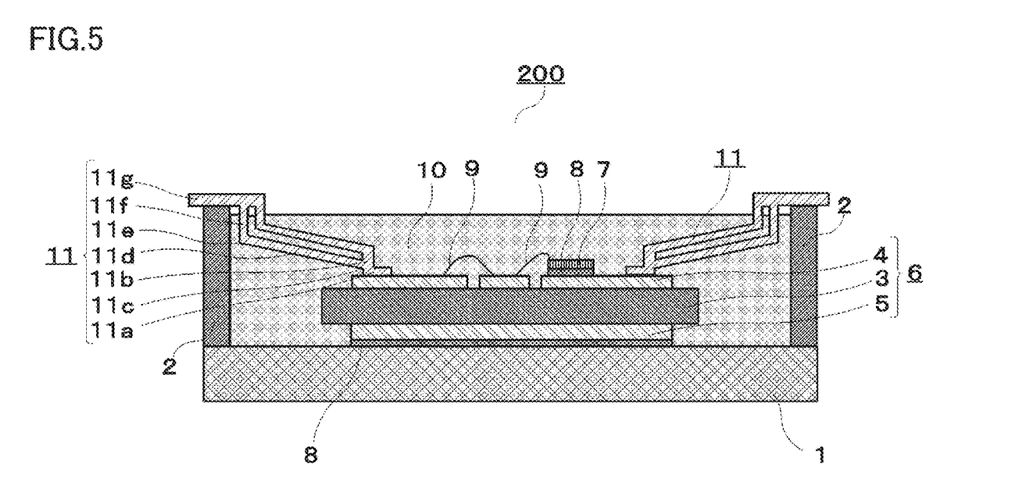
FIG. 5 is a schematic structural cross-sectional view showing another semiconductor device in the first embodiment of the present invention.

FIG. 5 is a schematic structural cross-sectional view showing another semiconductor device in the first embodiment of the present invention. In the figure, a semiconductor device 200 includes base plate 1, case member 2, insulating substrate 6, semiconductor element 7, joining materials 8, bonding wires 9, filling member 10, and electrode terminals 11, which are metal members. FIG. 5 shows a case where two (sheets of) electrode terminals 11 are disposed vertically in parallel and are used as parallel plates. Corresponding portions of upper and lower electrode terminals 11 are the same sites, but for convenience, reference signs are given to lower electrode terminal 11.

As shown in FIG. 5, in semiconductor device 200, two (sheets of) electrode terminals 11 may be disposed in parallel because of electrical design. Employing such an electrode terminal structure can increase an amount of current flowing through electrode terminals 11 without increasing the size of the semiconductor device, even when the amount of current (current density) flowing through each of electrode terminals 11 is the same. Alternatively, when the amount of current flowing through electrode terminals 11 is the same, the current density of each of electrode terminals 11 can be reduced. With such a structure, heat generation during operation of the semiconductor device can be suppressed.

Even in the case of such a structure, since inclined portions 11d of electrode terminals 11 lean toward the upper surface side of filling member 10, not only a parallel plate state can be maintained, but also the air bubbles on the lower surface side of electrode terminals 11 can rise along inclined portions 11d of electrode terminals 11, and a semiconductor device in which no air bubbles remain on the lower surface side of electrode terminals 11 can be manufactured. Note that while terminal portion 11g of each of electrode terminals 11 is provided on the upper side of case member 2 in the outer peripheral portion of base plate 1, even when terminal portion 11g of electrode terminals 11 is formed above a central portion of insulating substrate 6, the same effects can be obtained. In other words, the case where terminal portion 11g (the other end) of electrode terminals 11 is provided closer to case member 2 than joining portion 11a (the one end) of electrode terminals 11, and the case where joining portion 11a (the one end) of electrode terminals 11 is provided closer to case member 2 than terminal portion 11g (the other end) of electrode terminals 11 bring about similar effects.

In each of semiconductor devices 100, 200 configured as described above, since each of electrode terminals 11 is disposed inside filling member 10, and is shaped such that it leans toward the upper surface side of filling member 10, and the other end of electrode terminal 11 is separated from the inner wall of case member 2 and is exposed from the upper surface of filling member 10, the air bubbles do not remain on the lower surface side of electrode terminal 11 inside filling member 10, and peeling between filling member 10 and electrode terminal 11 can be suppressed.

Further, since electrode terminal 11 is disposed inside filling member 10, and is shaped such that it leans toward the upper surface side of filling member 10, and the other end of electrode terminal 11 is separated from the inner wall of case member 2 and exposed from the upper surface of filling member 10, the air bubbles do not remain on the lower surface side of electrode terminal 11 inside filling member 10, so that peeling between filling member 10 and electrode terminal 11 can be suppressed, insulation characteristics can be improved, and the reliability of the semiconductor device can be improved.

Further, since electrode terminal 11 is shaped such that it leans toward the upper surface side of filling member 10 in the cross section in the direction connecting the one end of electrode terminal 11 and the other end of electrode terminal 11, the air bubbles do not remain on the lower surface side of electrode terminal 11 inside filling member 10, and the peeling between filling member 10 and electrode terminal 11 can be suppressed. As a result, the insulation characteristics can be improved by the suppression of the peeling between filling member 10 and electrode terminal 11, and the reliability of the semiconductor device can be improved.

Further, since electrode terminal 11 is shaped such that it leans toward the upper surface of filling member 10 in the cross section in the direction parallel to the current flowing direction of electrode terminal 11, the air bubbles do not remain on the lower surface side of electrode terminal 11 inside filling member 10, and the peeling between filling member 10 and electrode terminal 11 can be suppressed. As a result, the insulation characteristics can be improved by the suppression of the peeling between filling member 10 and electrode terminal 11, and the reliability of the semiconductor device can be improved.

Furthermore, electrode terminals 11 are disposed vertically, and have a parallel plate shape, and thus, when the amount of current flowing through each of electrode terminals 11 is the same, the amount of current flowing through electrode terminals 11 can be increased without increasing the size of semiconductor device 100. Alternatively, when the amount of current flowing through electrode terminals 11 is the same, the current density of each of electrode terminals 11 can be reduced. With such a structure, heat generation during operation of the semiconductor device can be suppressed.

Further, since electrode terminal 11 is disposed inside filling member 10, and is shaped such that it leans toward the upper surface side of filling member 10, and the other end of electrode terminal 11 is separated from the inner wall of case member 2 and exposed from the upper surface of filling member 10, the degree of freedom in selecting the material of filling member 10 is expanded.

Second Embodiment

Figure 6:
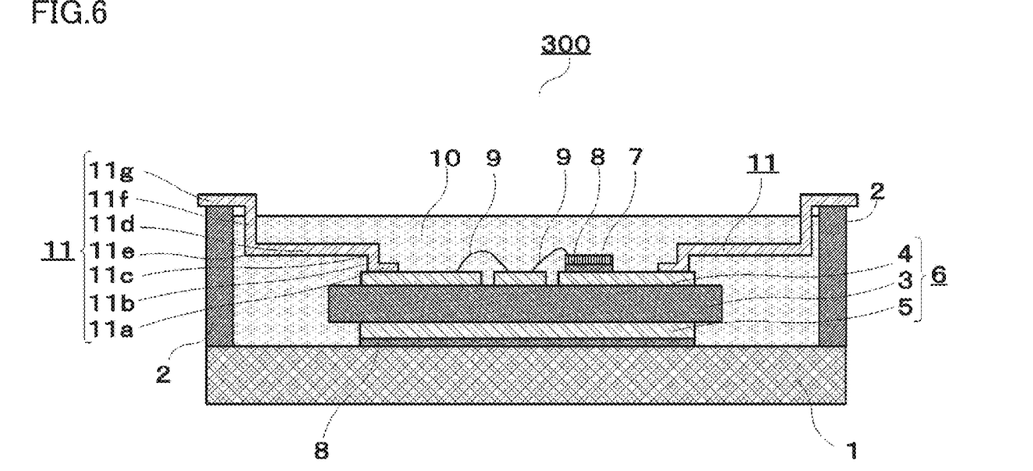
FIG. 6 is a schematic structural cross-sectional view showing a semiconductor device in a second embodiment of the present invention.

A second embodiment is different in the lean of electrode terminal 11 used in the first embodiment inside filling member 10, that is, in that electrode terminal 11 is inclined toward the upper surface side of filling member 10 in a cross section in a direction crossing the direction connecting the one end of electrode terminal 11 and the other end of electrode terminal 11. In this way, since in the cross section in the direction crossing the direction connecting the one end of electrode terminal 11 and the other end of electrode terminal 11, electrode terminal 11 leans toward the upper surface side of filling member 10, the air bubbles do not remain on the lower surface side of electrode terminal 11 inside filling member 10, and the peeling between filling member 10 and electrode terminal 11 can be suppressed. As a result, insulation failure of a semiconductor device 300 can be suppressed, and the reliability of semiconductor device 300 can be improved. Further, since a distance of a leaning surface (slope) of inclined portion 11d of electrode terminal 11 where the air bubbles move can be shortened, the air bubble can be moved from the lower side of electrode terminal 11 in a short time. Since the other points are the same as those in the first embodiment, detailed description thereof will be omitted.

FIG. 6 is a schematic structural cross-sectional view showing the semiconductor device in the second embodiment of the present invention. In the figure, semiconductor device 300 includes base plate 1, case member 2, insulating substrate 6, semiconductor element 7, joining materials 8, bonding wires 9, filling member 10, and electrode terminals 11, which are metal members. Further, each of electrode terminals 11 includes joining portion 11a, leg portions 11b, 11f, bent portions 11c, 11e, inclined portion 11d, and terminal portion 11g.

Figure 7:
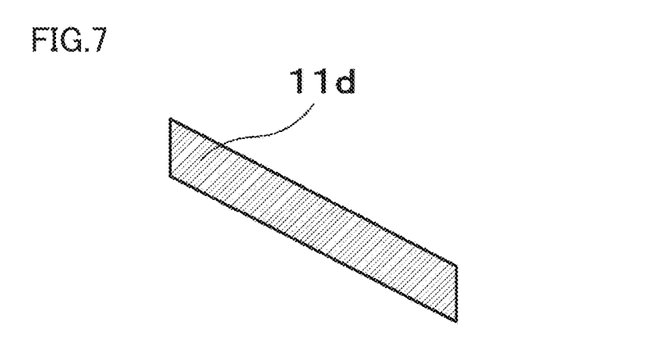
FIG. 7 is a schematic structural cross-sectional view showing a metal member of the semiconductor device in the second embodiment of the present invention.
Figure 8:
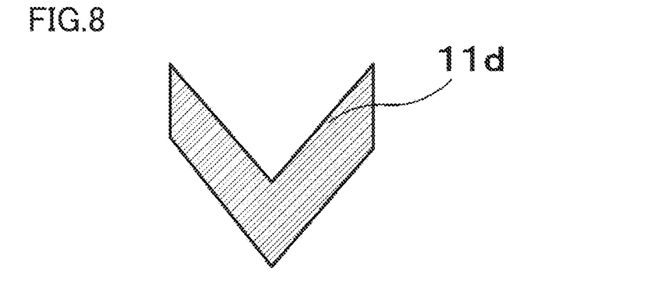
FIG. 8 is a schematic structural cross-sectional view showing another metal member of the semiconductor device in the second embodiment of the present invention.
Figure 9:
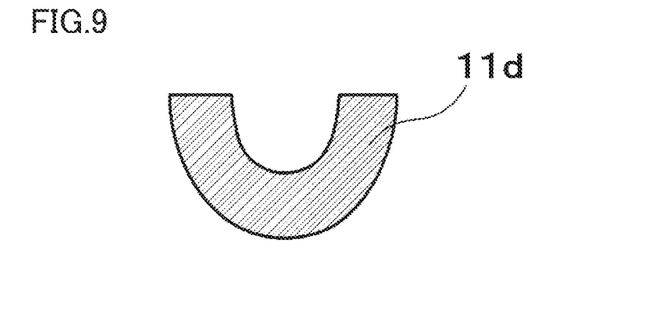
FIG. 9 is a schematic structural cross-sectional view showing another metal member of the semiconductor device in the second embodiment of the present invention.

FIG. 7 is a schematic structural cross-sectional view showing the metal member of the semiconductor device in the second embodiment of the present invention. FIG. 8 is a schematic structural cross-sectional view showing another metal member of the semiconductor device in the second embodiment of the present invention. FIG. 9 is a schematic structural cross-sectional view showing another metal member of the semiconductor device according to the second embodiment of the present invention.

In FIG. 6, electrode terminal 11 leans toward the upper surface side of filling member 10 inside filling member 10. The leaning portion of electrode terminal 11 is inclined portion 11d. From a structural aspect, electrode terminal 11 leans toward the upper surface side of filling member 10 in the cross section in the direction crossing (perpendicular to) the direction connecting the one end of electrode terminal 11 and the other end of electrode terminal 11. In other words, electrode terminal 11 leans toward the upper surface side of filling member 10 in the cross section in the direction crossing the direction connecting joining portion 11a of electrode terminal 11 and terminal portion 11g of electrode terminal 11. From the viewpoint of the electric characteristics, in the cross section in the direction crossing the direction of the current flowing through electrode terminal 11, electrode terminal 11 leans toward the upper surface side of filling member 10.

In FIG. 7, inclined portion 11d of electrode terminal 11 has a linear shape in which the cross section in the direction crossing the direction of the current flowing through electrode terminal 11 leans (is inclined) in one direction. In FIG. 8, inclined portion 11d of electrode terminal 11 has a V-shaped cross section in the direction crossing the direction of the current flowing through electrode terminal 11, which is projected on the lower surface side of electrode terminal 11 and has one bending point. In FIG. 9, inclined portion 11d of electrode terminal 11 has a U-shaped cross section in the direction crossing the direction of the current flowing through electrode terminal 11, the U shape being formed by a curved line projected on the lower surface side of electrode terminal 11.

Electrode terminal 11 has a plate shape. As electrode terminal 11, for example, a copper plate having a thickness of 0.5 mm, and processed into a predetermined shape by etching, die punching or the like can be used. Electrode terminal 11 has a shape that leans toward the upper surface side of filling member 10 in the cross section in the direction crossing the direction of the current flowing through electrode terminal 11. Specifically, for example, in FIG. 7, electrode terminal 11 is shaped such that inclined portion 11d of electrode terminal 11 leans toward the upper surface side of filling member 10 when viewed in the direction crossing (direction perpendicular to) the direction of the current flowing through electrode terminal 11, and the air bubbles generated under electrode terminal 11 can rise along the leaning surface (slope). Further, in electrode terminal 11 as in the first embodiment, the distance of the slope is often shorter in the direction crossing the direction of the current than that in the same direction as the direction of the current, so that the air bubbles on the lower surface side of electrode terminal 11 can be earlier discharged from the lower surface side of electrode terminal 11 to the outside of filling member 10.

Inclined portion 11d of electrode terminal 11 is supposed to be formed by bending or pressing a plate material, and is characterized in that the upper and lower surfaces of the electrode plate are parallel to each other. Further, as shown in the first embodiment, electrode terminals 11 may be disposed in a parallel plate shape.

Even in the case of such a structure, since electrode terminal 11 is disposed inside filling member 10, and is shaped such that it leans toward the upper surface side of filling member 10, and the other end of electrode terminal 11 is exposed from the upper surface of filling member 10, the air bubbles do not remain on the lower surface side of electrode terminal 11 inside filling member 10, and the peeling between filling member 10 and electrode terminal 11 can be suppressed.

In semiconductor device 300 configured as described above, since electrode terminal 11 is disposed inside filling member 10, and is shaped such that it leans toward the upper surface side of filling member 10, and the other end of electrode terminal 11 is separated from the inner wall of case member 2 and is exposed from the upper surface of filling member 10, the air bubbles do not remain on the lower surface side of electrode terminal 11 inside filling member 10, and the peeling between filling member 10 and electrode terminal 11 can be suppressed.

Further, since electrode terminal 11 is disposed inside filling member 10 and is shaped such that it leans toward the upper surface side of filling member 10, and the other end of electrode terminal 11 is separated from the inner wall of case member 2 and is exposed from the upper surface of filling member 10, the air bubbles do not remain on the lower surface side of electrode terminal 11 inside filling member 10, and the peeling between filling member 10 and electrode terminal 11 is suppressed, so that the insulation characteristics can be improved, and the reliability of the semiconductor device can be improved.

Furthermore, since electrode terminal 11 is shaped such that it leans toward the upper surface side of filling member 10 in the cross section in the direction crossing the direction connecting one end of electrode terminal 11 and the other end of electrode terminal 11, the air bubbles do not remain on the lower surface side of electrode terminal 11 inside filling member 10, and the peeling between filling member 10 and electrode terminal 11 can be suppressed. Further, by suppressing the peeling between filling member 10 and electrode terminal 11, the insulation characteristics can be improved and the reliability of the semiconductor device can be improved. Furthermore, a moving distance of the air bubbles can be shortened, and the air bubbles can be removed from the lower surface side of electrode terminal 11 in a short time.

In addition, since electrode terminal 11 is shaped such that the cross section thereof in the direction crossing the direction of the current flowing through electrode terminal 11 leans in a direction of the upper surface of filling member 10, the air bubbles do not remain on the lower surface side of electrode terminal 11 inside filling member 10, and the peeling between filling member 10 and electrode terminal 11 can be suppressed. Further, by suppressing the peeling between filling member 10 and electrode terminal 11, the insulation characteristics can be improved and the reliability of the semiconductor device can be improved. Moreover, the moving distance of the air bubbles can be shortened, and the air bubbles can be removed from the lower surface side of electrode terminal 11 in a short time.

Furthermore, since the two sheets of electrode terminals 11 are disposed vertically and have a parallel plate shape, when the amount of current flowing through each of electrode terminals 11 is the same, the amount of current flowing through electrode terminals 11 can be increased without increasing a size of semiconductor device 300. Alternatively, when the amount of current flowing through electrode terminals 11 is the same, the current density of each of electrode terminals 11 can be reduced. With such a structure, heat generation during operation of the semiconductor device can be suppressed.

Further, since electrode terminal 11 is disposed inside filling member 10, and is shaped such that it leans toward the upper surface side of filling member 10, and the other end of electrode terminal 11 is separated from the inner wall of case member 2 and exposed from the upper surface of filling member 10, the degree of freedom in selecting the material of filling member 10 is expanded.

Third Embodiment

Figure 10:
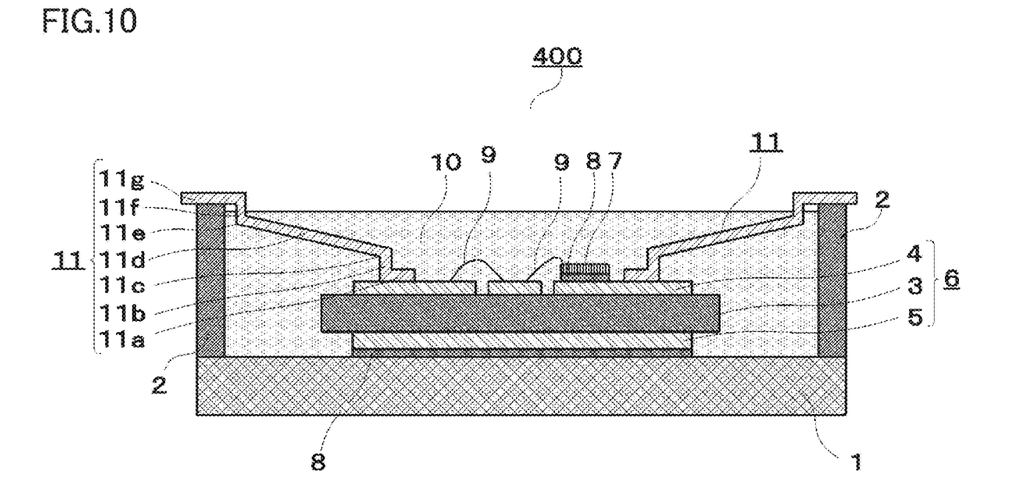
FIG. 10 is a schematic structural cross-sectional view showing a semiconductor device in a third embodiment of the present invention.

A third embodiment is different in that through holes 11h penetrating each of electrode terminals 11 are provided in plan view of electrode terminal 11 used in the first embodiment. In this way, since through holes 11h penetrating metal member 11 are formed in electrode terminal 11 in plan view, the air bubbles on the lower surface side of electrode terminal 11 can pass through holes 11h and escape above electrode terminals 11 while rising along inclined portion 11d of electrode terminal 11, so that the air bubbles inside filling member 10 can be earlier discharged to the outside of filling member 10. As a result, insulation failure of a semiconductor device 400 can be suppressed, and reliability of semiconductor device 400 can be improved. Since the other points are similar to the first embodiment, detailed description thereof will be omitted.

Figure 11:
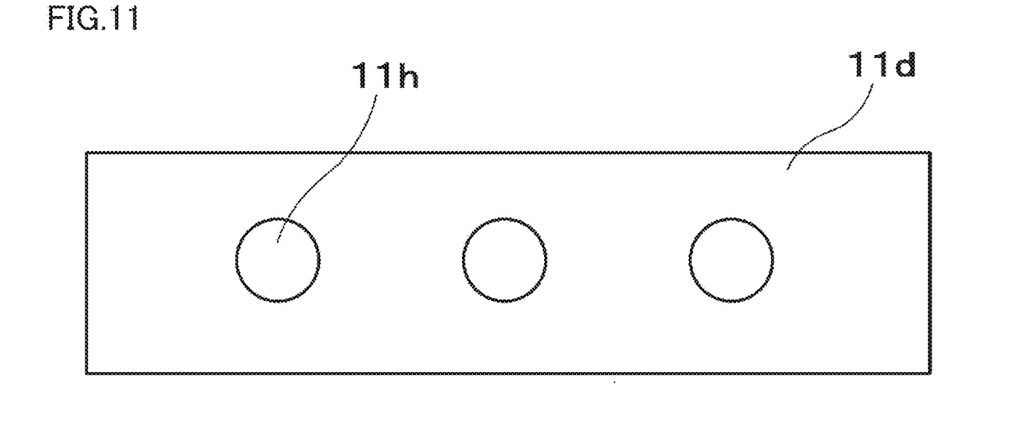
FIG. 11 is a schematic structural plan view showing a metal member of the semiconductor device in the third embodiment of the present invention.
Figure 12:
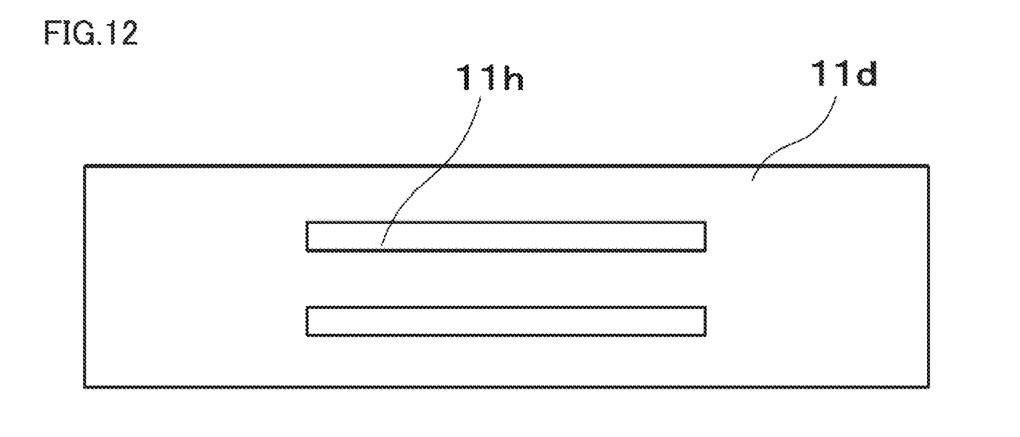
FIG. 12 is a schematic structural plan view showing another metal member of the semiconductor device in the third embodiment of the present invention.

FIG. 10 is a schematic structural cross-sectional view showing the semiconductor device according to the third embodiment of the present invention. FIG. 11 is a schematic structural plan view showing the metal member of the semiconductor device according to the third embodiment of the present invention. FIG. 12 is a schematic structural plan view showing another metal member of the semiconductor device according to the third embodiment of the present invention.

In FIG. 10, semiconductor device 400 includes base plate 1, case member 2, insulating substrate 6, semiconductor element 7, joining materials 8, bonding wires 9, filling member 10, and electrode terminals 11, which are the metal members.

In FIG. 10, electrode terminal 11 includes joining portion 11a, leg portions 11b, 11f, bent portions 11c, 11e, inclined portion 11d, and terminal portion 11g. Electrode terminal 11 has a plate shape. As electrode terminal 11, for example, a copper plate having a thickness of 0.5 mm, and processed into a predetermined shape by etching, die punching or the like can be used.

Through holes 11h are provided in inclined portion 11d of electrode terminal 11. In FIG. 11, a shape of each of through holes 11h of electrode terminal 11 is circular. In FIG. 12, the shape of each of through holes 11h of electrode terminal 11 is a slit shape. The shape of through hole 11h of electrode terminal 11 is not limited to these, and may be polygonal such as quadrilateral. Further, the larger a size of through hole 11h is, and the larger a number of through holes 11h is, the easier the air bubbles are to escape above electrode terminal 11 through through holes 11h. The size and number of through holes 11h of electrode terminal 11 are not particularly limited as long as electrode terminal 11 satisfies electrical performance in the use of the semiconductor device.

In FIGS. 11, 12, a dimension of inclined portion 11d may be changed in the direction crossing the current flowing direction of inclined portion 11d in accordance with the size of through hole 11h so that the current density in electrode terminal 11 is the same. That is, a width of a portion of inclined portion 11d where through holes 11h exist is larger than that of a portion where no through hole 11h exists in plan view. This can make the current density in inclined portion 11d uniform.

In the third embodiment, as shown in FIGS. 10, 11, when electrode terminal 11 is viewed from above the semiconductor device (in plan view), electrode terminal 11 has the shape having through holes 11h penetrating inclined portion 11d of electrode terminal 11. By providing through holes 11h in electrode terminal 11, the air bubbles on the lower surface side of electrode terminal 11 can pass through through holes 11h and escape above electrode terminal 11 (to the upper surface side) while rising along inclined portion 11d of electrode terminal 11 inside filling member 10, so that the air bubbles inside filling member 10 can be earlier discharged to the outside of filling member 10.

In addition, a groove (guide groove, guide) connected to each of through holes 11h may be provided on the lower surface of electrode terminal 11 in order to easily guide the air bubbles to through hole 11h. Further, a periphery of through hole 11h may be chamfered in order to easily guide the air bubbles in the periphery of through hole 11h to through hole 11h. Further, as described in the first embodiment, electrode terminals 11 may be disposed in the parallel plate shape. In this case, through holes 11h may be disposed linearly with respect to upper and lower electrode terminals 11, or may be disposed alternately with respect to upper and lower electrode terminals 11.

Even in the case of such a structure, since electrode terminal 11 is disposed inside filling member 10, and is shaped such that it leans toward the upper surface side of filling member 10, and the other end of electrode terminal 11 is separated from the inner wall of case member 2 and is exposed from the upper surface of filling member 10, the air bubbles do not remain on the lower surface side of electrode terminal 11 inside filling member 10, and the peeling between filling member 10 and electrode terminal 11 can be suppressed. Further, since through holes 11h are provided in electrode terminal 11, the moving distance of the slope of the air bubbles can be shortened, and the air bubbles can be removed from the lower surface side of electrode terminal 11 in a short time. Therefore, the defoaming treatment for removing the air bubbles can be performed in a short time.

In semiconductor device 400 configured as described above, since electrode terminal 11 is disposed inside filling member 10, and is shaped such that it leans toward the upper surface side of filling member 10, and the other end of electrode terminal 11 is separated from the inner wall of case member 2 and is exposed from the upper surface of filling member 10, the air bubbles do not remain on the lower surface side of electrode terminal 11 inside filling member 10, and the peeling between filling member 10 and electrode terminal 11 can be suppressed.

Further, since electrode terminal 11 is disposed inside filling member 10, and is shaped such that it leans toward the upper surface side of filling member 10, and the other end of electrode terminal 11 is separated from the inner wall of case member 2 and is exposed from the upper surface of filling member 10, the air bubbles do not remain on the lower surface side of electrode terminal 11 inside filling member 10, and the peeling between filling member 10 and electrode terminal 11 is suppressed, so that the insulation characteristics can be improved, and the reliability of the semiconductor device can be improved.

Further, since two sheets of electrode terminals 11 are disposed vertically and have a parallel plate shape, when the amount of current flowing through each of electrode terminals 11 is the same, the amount of current flowing through electrode terminals 11 can be increased without increasing a size of semiconductor device 400. Alternatively, when the amount of current flowing through electrode terminals 11 is the same, the current density of each of electrode terminals 11 can be reduced. With such a structure, heat generation during operation of the semiconductor device can be suppressed.

Further, since electrode terminal 11 is disposed inside filling member 10, and is shaped such that it leans toward the upper surface side of filling member 10, and the other end of electrode terminal 11 is separated from the inner wall of case member 2 and is exposed from the upper surface of filling member 10, the degree of freedom in selecting the material of filling member 10 is expanded.

Furthermore, since electrode terminal 11 is provided with through holes 11h penetrating electrode terminal 11 in plan view, the air bubbles can escape from positions of through holes 11h to the upper surface side of electrode terminal 11 without moving from the one end side to the other end side of electrode terminal 11 inclined to the upper surface side of filling member 10, so that the moving distance of the air bubbles is shortened and the defoaming treatment can be performed in a short time.

Fourth Embodiment

In a fourth embodiment, the semiconductor device according to each of the first to third embodiments described above is applied to a power conversion device. While the present invention is not limited to a specific power conversion device, a case where the present invention is applied to a three-phase inverter will be described below as the fourth embodiment.

Figure 13:
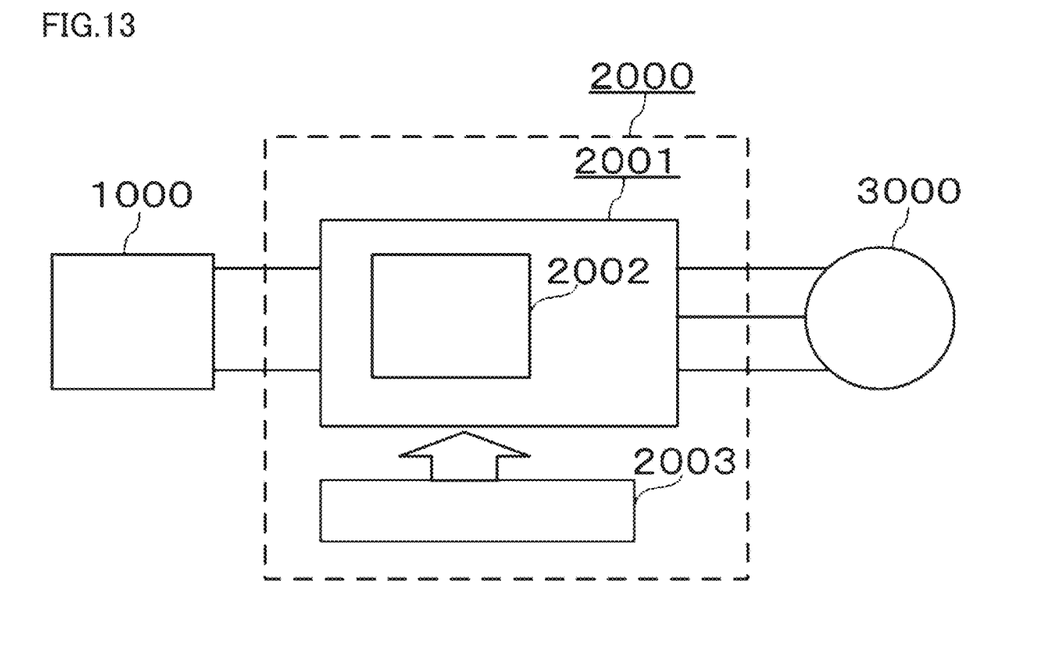
FIG. 13 is a block diagram showing a configuration of a power conversion system to which the semiconductor device in any of the first to third embodiments of the present invention is applied.

FIG. 13 is a block diagram showing a configuration of a power conversion system to which the power conversion device in the fourth embodiment of the present invention is applied.

The power conversion system shown in FIG. 13 includes a power supply 1000, a power conversion device 2000, and a load 3000. Power supply 1000 is a DC power supply and supplies a DC power to power conversion device 2000. Power supply 1000 can be configured by various things, for example, a DC system, a solar battery, a storage battery, or may be configured by a rectifier circuit connected to an AC system, an AC/DC converter, or the like. Further, power supply 1000 may be configured by a DC/DC converter that converts a DC power output from the DC system into a predetermined power.

Power conversion device 2000 is a three-phase inverter connected between power supply 1000 and load 3000, converts a DC power supplied from power supply 1000 into an AC power, and supplies the AC power to load 3000. As shown in FIG. 13, power conversion device 2000 includes a main conversion circuit 2001 configured to convert the DC power input from power supply 1000 into the AC power and outputs the AC power, and a control circuit 2003 configured to output a control signal for controlling main conversion circuit 2001 to main conversion circuit 2001.

Load 3000 is a three-phase electric motor driven by the AC power supplied from power conversion device 2000. Note that load 3000 is not limited to a specific use, and is an electric motor mounted on various electric apparatuses, and is used as, for example, an electric motor for a hybrid car, an electric car, a railway vehicle, an elevator, an air conditioner, or the like.

Hereinafter, details of power conversion device 2000 will be described. Main conversion circuit 2001 includes a switching element, which is semiconductor element 7 incorporated in a semiconductor device 2002, and a freewheel diode (not shown), and switching the switching element allows the DC power supplied from power supply 1000 to be converted into the AC power and be supplied to load 3000. While there are various concrete circuit configurations of main conversion circuit 2001, main conversion circuit 2001 according to the present embodiment is a two-level three-phase full bridge circuit, and has six switching elements and six freewheeling diodes connected to the respective switching elements in reverse parallel. Main conversion circuit 2001 is configured by semiconductor device 2002 corresponding to any one of the above-described first to third embodiments, which incorporates each of the switching elements, each of the freewheel diodes, and the like. The six switching elements are connected in series by two to form upper and lower arms, and each of the upper and lower arms configures each phase (a U phase, a V phase, a W phase) of a full bridge circuit. Output terminals of the upper and lower arms, that is, three output terminals of main conversion circuit 2001 are connected to load 3000.

Main conversion circuit 2001 also includes a drive circuit (not shown) configured to drive each of the switching elements. The configuration may be such that the drive circuit is incorporated in semiconductor device 2002, or is provided separately from semiconductor device 2002. The drive circuit generates a drive signal for driving the switching element of main conversion circuit 2001, and supplies the drive signal to a control electrode of the switching element of main conversion circuit 2001. Specifically, a drive signal for bringing the switching element into an ON state, and a drive signal for bringing the switching element into an OFF state are output to the control electrode of each of the switching elements in accordance with the control signal from control circuit 2003 described later. When the switching element is maintained in the ON state, the drive signal is a voltage signal (ON signal) higher than or equal to a threshold voltage of the switching element, and when the switching element is maintained in the OFF state, the drive signal is a voltage signal (OFF signal) lower than or equal to the threshold voltage of the switching element.

Control circuit 2003 controls the switching elements of main conversion circuit 2001 so that desired electric power is supplied to load 3000. Specifically, time (ON time) when each of the switching elements of main conversion circuit 2001 should be in the ON state is calculated on the basis of the power to be supplied to load 3000. For example, main conversion circuit 2001 can be controlled by PWM control that modulates the ON time of the switching element in accordance with the voltage to be output. Further, a control command (control signal) is output to the drive circuit included in main conversion circuit 2001 at each time point so that the ON signal is output to the switching element that should be in the ON state, and the OFF signal is output to the switching element that should be in the OFF state. The drive circuit outputs the ON signal or the OFF signal as the drive signal to the control electrode of each of the switching elements in accordance with this control signal.

In the power conversion device according to the fourth embodiment configured as described above, since the semiconductor device according to any one of the first to third embodiments is applied as semiconductor device 2002 of main conversion circuit 2001, the improvement of the reliability can be realized.

While in the present embodiment, the example in which the present invention is applied to the two-level three-phase inverter has been described, the present invention is not limited thereto and can be applied to various power conversion devices. While in the present embodiment, the two-level power conversion device is used, a three-level or a multi-level power conversion device may be used, and when the power is supplied to a single-phase load, the present invention is applied to a single-phase inverter. Further, when the power is supplied to a DC load or the like, the present invention can also be applied to a DC/DC converter, an AC/DC converter, or the like.

Further, the power conversion device to which the present invention is applied is not limited to the case where the above-mentioned load is an electric motor, and it can also be used as, for example, an electric discharge machine, a laser processing machine, an induction heating cooker, a power supply device for a non-contact device power supply system, or the like, and further, can also be used as a power conditioner for a solar power generation system, a power storage system, or the like.

In particular, when SiC is used as semiconductor element 7, in order to take advantage of its characteristics, a power semiconductor element is operated at a higher temperature than in the case of Si. Since higher reliability is required in a semiconductor device equipped with the SiC device, the merit of the present invention of realizing a highly reliable semiconductor device becomes more effective.

It should be understood that the above-described embodiments are illustrative in all points and not restrictive. The scope of the present invention is shown not by the scope of the above-described embodiments but by the claims, and includes meanings equivalent to the claims and all modifications within the scope. Further, the invention may be formed by appropriately combining the plurality of components disclosed in the above-described embodiments.

REFERENCE SIGNS LIST

1: base plate, 2: case member, 3: insulating layer, 4, 5: metal layer, 6: insulating substrate, 7: semiconductor element, 8: joining material, 9: bonding wire, 10: filling member, 11: electrode terminal, 11*a*: joining portion, 11*b*, 11*f*: leg portion, 11*c*, 11*e*: bent portion, 11*d*: inclined portion, 11*g*: terminal portion, 11*h*: through hole, 100, 200, 300, 400, 2002: semiconductor device, 1000: power supply, 2000: power conversion device, 2001: main conversion circuit, 2003: control circuit, 3000: load

The invention claimed is:

1. A semiconductor device comprising:
   an insulating substrate having a front surface and a back surface, and having a semiconductor element joined to the front surface;
   a base plate joined to the back surface of the insulating substrate;
   a case surrounding the insulating substrate;
   a filler having an upper surface, covering the insulating substrate, and filling a region surrounded by the base plate and the case; and
   a metal plate including an inclined portion that is angled upwardly toward an upper surface side of the filler inside the filler, the metal plate having one end joined to the front surface of the insulating substrate and another end separated from an inner wall of the case, and being exposed from the upper surface of the filler, the one end of the metal plate having a joining portion that is bent to join the front surface of the insulating substrate, and the other end of the metal plate having a terminal portion that is bent to connect to an outside, and the inclined portion of the metal plate connecting a bent portion at the one end and a bent portion at the other end,
   wherein the inclined portion has a horizontal component that is longer than any vertical portion of the metal plate, and
   wherein the metal plate includes a vertical portion where the metal plate protrudes through the upper surface of the filler.

2. The semiconductor device according to claim 1, wherein the inclined portion of the metal plate is angled toward the upper surface side of the filler in a cross section in a direction connecting the one end and the other end.

3. The semiconductor device according to claim 2, wherein the metal plate becomes closer to the upper surface of the filler as it goes from the one end toward the other end.

4. The semiconductor device according to claim 2, wherein a cross-sectional shape of the metal plate is a linear shape, a stepped shape, or a curved shape projected on the upper surface side or a lower surface side of the metal plate, and is angled toward the upper surface side of the filler.

5. The semiconductor device according to claim 1, wherein the inclined portion of the metal plate is angled toward the upper surface side of the filler in a cross section in a direction crossing a direction connecting the one end and the other end.

6. The semiconductor device according to claim 5, wherein a cross-sectional shape of the metal plate is a V shape or a U shape that is projected on a lower surface side of the metal plate, and is angled toward the upper surface side of the filler.

7. The semiconductor device according to claim 1, wherein the inclined portion of the metal plate is angled toward the upper surface side of the filler in a cross section in a same direction as a direction of a current flowing through the metal plate.

8. The semiconductor device according to claim 1, wherein the inclined portion of the metal plate is angled toward the upper surface side of the filler in a cross section in a direction crossing a direction of a current flowing through the metal plate.

9. The semiconductor device according to claim 1, wherein the metal plate has sites that are parallel to each other between the one end and the other end.

10. The semiconductor device according to claim 1, wherein the metal plate has a through hole penetrating the metal plate in plan view.

11. The semiconductor device according to claim 1, wherein in the metal plate the other end is closer to the case than the one end, or the one end is closer to the case than the other end.

12. A power conversion device comprising:
   a main conversion circuit having the semiconductor device according to claim 1, and configured to convert and output an input power; and a control circuit configured to output a control signal for controlling the main conversion circuit to the main conversion circuit.

13. The semiconductor device according to claim 1, wherein:
   the metal plate includes a horizontal portion connected to the vertical portion outside of the filler.

14. The semiconductor device according to claim 1, further comprising:
   a gap between the inner wall and the vertical portion.

15. A semiconductor device comprising:
   an insulating substrate having a front surface and a back surface, and having a semiconductor element joined to the front surface;
   a base plate joined to the back surface of the insulating substrate;
   a case surrounding the insulating substrate;
   a filler having an upper surface, covering the insulating substrate, and filling a region surrounded by the base plate and the case; and
   a metal plate including an inclined portion that is angled upwardly toward an upper surface side of the filler inside the filler, the metal plate having one end joined to the front surface of the insulating substrate and another end separated from an inner wall of the case, and being exposed from the upper surface of the filler,
   the inclined portion of the metal plate being angled toward the upper surface side of the filler in a cross section in a direction crossing a direction connecting the one end and the other end,
   wherein the inclined portion has a horizontal component that is longer than any vertical portion of the metal plate, and
   wherein the metal plate includes a vertical portion where the metal plate protrudes through the upper surface of the filler.

16. The semiconductor device according to claim 15, wherein:
   the metal plate includes a horizontal portion connected to the vertical portion outside of the filler.

17. The semiconductor device according to claim 15, further comprising:
   a gap between the inner wall and the vertical portion.

18. A semiconductor device comprising:
   an insulating substrate having a front surface and a back surface, and having a semiconductor element joined to the front surface;
   a base plate joined to the back surface of the insulating substrate;
   a case surrounding the insulating substrate;
   a filler having an upper surface, covering the insulating substrate, and filling a region surrounded by the base plate and the case; and
   a metal plate including an inclined portion that is angled upwardly toward an upper surface side of the filler inside the filler, the metal plate having, one end joined to the front surface of the insulating substrate and another end separated from an inner wall of the case, and being exposed from the upper surface of the filler,
   the inclined portion of the metal plate being angled toward the upper surface side of the filler in a cross section in a direction crossing a direction of a current flowing through the metal,
   wherein the inclined portion has a horizontal component that is longer than any vertical portion of the metal plate, and
   wherein the metal plate includes a vertical portion where the metal plate protrudes through the upper surface of the filler.

19. The semiconductor device according to claim 18, wherein:
   the metal plate includes a horizontal portion connected to the vertical portion outside of the filler.

20. The semiconductor device according to claim 18, further comprising:
   a gap between the inner wall and the vertical portion.

* * * * *